(12) United States Patent
Alpert et al.

(10) Patent No.: US 7,036,104 B1
(45) Date of Patent: Apr. 25, 2006

(54) METHOD OF AND SYSTEM FOR BUFFER INSERTION, LAYER ASSIGNMENT, AND WIRE SIZING USING WIRE CODES

(75) Inventors: Charles Jay Alpert, Austin, TX (US); Steven Thomas Quay, Austin, TX (US); Anirudh Devgan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/455,057

(22) Filed: Dec. 6, 1999

(51) Int. Cl.
*G06F 17/50* (2006.01)

(52) U.S. Cl. .................. 716/10; 709/238; 716/13; 716/2; 716/18; 710/56; 713/153

(58) Field of Classification Search ............. 709/238; 710/56; 713/153; 716/3, 10
See application file for complete search history.

(56) References Cited

U.S. PATENT DOCUMENTS

| | | | |
|---|---|---|---|
| 5,305,229 A | 4/1994 | Dhar | 364/489 |
| 5,359,535 A | 10/1994 | Djaja et al. | 364/489 |
| 5,379,231 A | 1/1995 | Pillage et al. | 364/488 |
| 5,410,491 A | 4/1995 | Minami | 364/491 |
| 5,416,718 A | 5/1995 | Yamazaki | 364/488 |
| 5,508,937 A | 4/1996 | Abato et al. | 364/488 |
| 5,519,351 A | 5/1996 | Matsumoto | 327/295 |
| 5,557,779 A | 9/1996 | Minami | 395/500 |
| 5,610,830 A | 3/1997 | Ito et al. | 364/490 |
| 5,638,291 A * | 6/1997 | Li et al. | 716/18 |
| 5,764,528 A | 6/1998 | Nakamura | 364/489 |
| 5,799,170 A | 8/1998 | Drumm et al. | 395/500 |
| 5,825,661 A | 10/1998 | Drumm | 364/491 |
| 5,838,581 A | 11/1998 | Kuroda | 364/491 |
| 5,859,776 A | 1/1999 | Sato et al. | 364/468.28 |
| 5,883,808 A | 3/1999 | Kawarabayashi | 364/488 |
| 6,286,128 B1 * | 9/2001 | Pileggi et al. | 716/2 |

FOREIGN PATENT DOCUMENTS

| | | |
|---|---|---|
| JP | 06-085646 | 3/1994 |
| JP | 07-086410 | 3/1995 |

OTHER PUBLICATIONS

John Lillis, Chung–Kuan Cheng, Ting–Ting Y. Lin; Optimal and Efficient Buffer Insertion and Wire Sizing; 1995; University of California, San Diego; pp. 259–262.*

John Lillis, Chung–Kuan Cheng, Ting–Ting Y. Lin; Optimal Wire Sizing and Buffer Insertion for Low Power and a Generalized Delay Model; 1996; University of California, San Diego; pp. 437–447.*

Lukas Van Ginneken, "Buffer Placement in Distributed RC–Tree Networks for Minimal Elmore Delay", IBM, Thomas J. Watson Research Center, IEEE, 1990, pp. 865–868.

IBM Technical Disclosure Bulletin "Allocating Maximum RC Delays to Guarantee Timing by Depth First Search", vol. 35, No. 09B, Sep. 1993, pp. 301–303.

(Continued)

*Primary Examiner*—Anthony Knight
(74) *Attorney, Agent, or Firm*—Casimer K. Salys; Dillon & Yudell LLP

(57) ABSTRACT

A method of and system for optimizing a tree to meet timing constraints inserts buffers at selected ones of the internal nodes of a tree to form a plurality of subtrees. The method sizes the wires of the subtrees according to a wire code for each subtree, wherein each wire of a subtree has the same wire code. The buffers are inserted and the wires are sized such that slack along the path from a single source node to each sink node of the tree is equal to or greater than zero.

21 Claims, 3 Drawing Sheets

OTHER PUBLICATIONS

IBM Technical Disclosure Bulletin "Buffer Placement in Distributed RC Tree Networks for Minimal Elmore Delay", vol. 33, No. 8, Jan. 1991, pp. 338–341.

Jorge Rubinstein, et al. "Signal Delay in RC Tree Networks", IEEE Transactions on Computer Aided Design, vol. CAD–2, No. 3, Jul. 1983, pp. 202–211.

John Lillis, et al. "Optimal Wire Sizing and Buffer Insertion for Low Power and a Generalized Delay Model", IEEE Journal of Solid–State Circuits, vol. 31, No. 3, Mar. 1996, 437–447.

IBM Technical Disclosure Bulletin, "Algorithm for Incremental Timing analysis", vol. 38, No. 1, Jan. 1995, pp. 27–34.

Srinagesh Satyanarayana et al., "Resistive Interpolation Biasing: A Technique for Compensating Linear Variation in an Array of MOS Current Sources", IEEE Journal of Solid–State Circuits, vol. 30, No. 5, May 1995, pp. 595–596.

Alpert, et al., "Wire Segmenting for Improved Buffer Insertion", DAC Jun. 1997, Anaheim, Ca.

* cited by examiner

METHOD OF AND SYSTEM FOR BUFFER INSERTION, LAYER ASSIGNMENT, AND WIRE SIZING USING WIRE CODES

CROSS-REFERENCE TO RELATED APPLICATIONS

The present application is related to application Ser. No. 08/929,509, U.S. Pat. No. 6,044,209 filed Sep. 15, 1997, titled METHOD AND SYSTEM FOR SEGMENTING WIRES PRIOR TO BUFFER INSERTION; application Ser. No. 09/094,543, filed Jun. 12, 1998, titled METHOD FOR IMPROVING TIMING AND ELIMINATING UNACCEPTABLE NOISE IN INTEGRATED CIRCUIT DESIGN; application Ser. No. 09/094,544, U.S. Pat. No. 6,117,182 filed Jun. 12, 1998, titled OPTIMUM BUFFER PLACEMENT FOR NOISE AVOIDANCE; and, application Ser. No. 09/317,553, U.S. Pat. No. 6,437,393 filed May 24, 1999, titled METHOD AND APPARATUS FOR PERFORMING BUFFER INSERTION WITH ACCURATE GATE AND INTERCONNECT DELAY COMPUTATION.

FIELD OF THE INVENTION

The present invention relates generally to the field of integrated circuit design, and more particularly to a method of and system for inserting buffers and sizing wires in a tree circuit so as to satisfy circuit timing constraints and minimize resource utilization.

DESCRIPTION OF THE PRIOR ART

Integrated circuits include wiring trees or nets in which a signal propagates through wires from a single source device to multiple sink devices. In order to meet timing constraints for the tree, the signal must arrive at each sink at or before a required arrival time (RAT). With the increase in speed and interconnect size in VLSI circuits, timing considerations have become increasingly critical.

The propagation speed, and consequent delay, of a signal in a wire is a function of resistance and capacitance of the wire. Resistance and capacitance of a wire are both functions of the length of the wire. Accordingly, delay is a proportional to the square of the length of the wire. Additionally, the resistance of a wire per unit of length is a inversely related to the cross-sectional area of the wire, although capacitance is directly related to cross-sectional area. Generally, thin, narrow wires cause more delay than thick, wide wires.

Timing optimization techniques, such as buffer insertion and wire sizing, have gained widespread acceptance. Buffer insertion can decouple large loads and reduce delays of long interconnects by dividing them into shorter pieces. The insertion of buffers in a long wire makes the delay essentially linear, rather than quadratic. Wire sizing and layer assignment, especially when thick metal layers are available, can reduce interconnect resistance, and thereby reduce delay.

The close dependence between the objectives of buffer insertion and wire sizing has led to several efforts that simultaneously insert buffers and wire sizes. However, those efforts have tended to be computationally inefficient or produce solutions that are not optimum.

SUMMARY OF THE INVENTION

The present invention provides a method of and system for optimizing a tree to meet timing constraints. The tree includes a single source node interconnected by wires to a plurality of sink nodes through a plurality of internal nodes. The method of the present invention inserts buffers at selected ones of the internal nodes of the tree to form a plurality of subtrees. The method sizes the wires of the subtrees according to a wire code for each subtree. According to the present invention, each wire of a subtree has the same wire code. The buffers are inserted and the wires are sized such that slack along the path from the source node to each sink node is equal to or greater than zero.

A wire code according to the present invention includes a layer assignment part and a width part for a wire assigned to a layer. The layer assignment code specifies a semiconductor layer for the wire, and the width code specifies a width for the wire. The layer assignment part includes a horizontal layer code and a vertical layer code, and the width part includes a horizontal width code defining a width for a wire in the horizontal layer and a vertical width code defining a width for a wire in the vertical layer.

Preferably, the buffers are inserted and the wires are sized according to a balancing parameter. The balancing parameter specifies a balance between buffer insertion and wire sizing. The cost of buffer insertion and wire sizing is a function of said balancing parameter. The method inserts the buffers and sizes the wires such that the cost is equal to or less than a predefined upper cost bound.

DESCRIPTION OF THE PREFERRED EMBODIMENT

A Steiner tree $$T = (V, E)$$

contains a set of n nodes V and a set of n−1 wires E. The set of nodes $$V = \{\{so\} \cup SI \cup IN\},$$

where so is the unique source node, SI is the set of sink nodes, and IN is the set of internal nodes. A wire e in E is defined by an ordered pair of nodes e=(x,y) for which the signal propagates from x to y. Each node v, other than the source node so, has a unique parent wire. A sink node si has no children. The tree is assumed to be binary, i.e. each node can have at most two children. The left and right children of node v are denoted T. Left(v) and T. Right(v), respectively. By convention, if node v has only one child, it is denoted T. Left(v).

Figure 1:
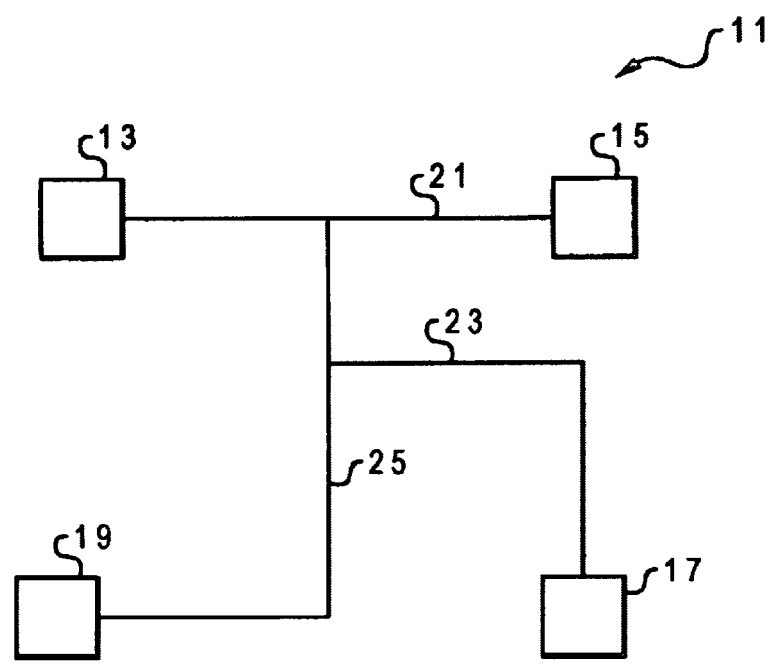
FIG. 1 is a plan view of a tree or net without buffer insertion and wire sizing according to the present invention.

Referring now to FIG. 1, a relatively simple tree is designated generally by the numeral 11. Tree 11 includes a source node 13 and sink nodes 15–19. Source node 13 is interconnected with sink nodes 15–19 by wires 21–25, respectively. Tree 11 can include any number of internal nodes. According to the present invention, an internal node may be placed at any position along a wire.

A wire code is a 4-tuple $$(L_h, w_h, L_v, w_v),$$

where $$L_h$$

and $$L_v$$

are horizontal and vertical layers, respectively, and $$w_h$$

and $$w_v$$

are the widths of the wires running on the respective layers. The wire code restricts the possible widths and layers assigned to each wire.

$$W = \{w_1, w_2, \ldots, w_m\}$$

denotes the set of possible wire codes. For purposes of illustration, the wire code for wires 21–25 of FIG. 1 is (M1, 3,M2, 5). Thus, in the tree of FIG. 1, each horizontal wire segment must be on layer M1 and have a width of 3. Similarly, each vertical wire segment must be on layer M2 and have a width of 5.

The problem according to the present invention is, for a given tree $$T = (\{\{so\} \cup SI \cup IN\}, E),$$

a buffer type b, and a set of wire codes W, to find a mapping M that maximizes slack and satisfies a set of constraints, to be described hereinafter. As will be explained in detail hereinafter, slack is the difference required arrival time (RAT) and the delay for the path between the source node so and a sink node si.

The mapping $$M: V \cup E \to W \cup \{b, \emptyset\}$$

denotes a problem solution. For each internal node $$v = IN,$$

the mapping $$M(v) = b,$$

implies that a buffer b is inserted at node v, and $$M(v) = \emptyset$$

implies no buffer at node v. For each wire $$e \in E,$$

the mapping $$M(e) = w,$$

assigns a wire code w to wire e. For each source node or sink node $$v = \{so\} \cup SI,$$

the mapping $$M(v) = g,$$

where g is the gate located at the source or sink node v.

Assigning k buffers to tree T induces k+1 nets and k+1 subtrees with no internally placed buffers. Let $$T(v, M) = (\{v\} \cup SI_{T(v,M)} \cup IN_{T(v,M)}, E_{T(v,M)})$$

be the maximal subtree of t with source v and $$M(v) = \emptyset$$

for each $$v \in IN_{T(v,M)}.$$

For each node $$v \in V$$

such that $$M(v) \neq \emptyset,$$

let $$C_{M(v)}$$

denote input capacitance, $R_{M(v)}$ the resistance, and $K_{M(v)}$ the intrinsic delay of the gate or buffer $M(v)$.

Let $$C_{e,w}$$

and $$R_{e,w}$$

respectively denote the lumped capacitance and resistance for a wire $$e \in E$$

assigned a wire code w.

The wire capacitance and resistance can be calculated in many ways. For example, if wire code $$w = (L_h, w_h, L_v, w_v),$$

then one can assume unit area resistance R for layer $$L_v.$$

The resistance for a vertical wire is then $$R_{e,w} = R l_e / w_v,$$

where $$l_e$$

is the length of e. Similarly, if $$C_a$$

and $$C_f$$

denote the unit area capacitance and fringing capacitance, respectively, for layer $$L_v,$$

then the wire capacitance is $$C_{e,w} = l_e(C_a w_v + C_f).$$

The capacitance load $$C_{T(v,M)}$$

seen at any node v is defined as $$C_{T(v,M)} = \sum_{x \in SI_{T(v,M)}} C_{M(x)} + \sum_{e \in E_{T(v,M)}} C_{e,M(e)}.$$

The Elmore delay for a wire e is given by $$D(e = (x, y), M) = R_{e,M(e)}(C_{e,M(e)}/2 + C_{T(y,M)}).$$

The delay through a node v is given by $$D(v, M) = K_{M(v)} + R_{M(v)} C_{T(v,M)}$$

if $$M(v) \neq \varnothing$$

and zero otherwise. The total delay $$D(v, si, M)$$

from node v to sink $$si \in SI$$

with respect to a solution M is $$\sum_{e=(x,y) \in path(v,si)} D(e, M(e)) + D(x, M(x)),$$

where $$path(v, si)$$

is the set of wires on the path from node v to sink si.

Each sink si has required arrival time RAT(si), assuming the input signal arrives at the source so at time zero. The condition $$\forall si \in SI, D(so, si, M) \leq RAT(si)$$

must hold for the circuit to meet timing requirements. Let $$q(v, M) = \min_{si \in ds(v)} RAT(si) - D(v, si, M)$$

be the slack at node v for every $$v \in V$$

with respect to M, where ds(v) is the set of sinks downstream from node v. Slack (q(v,M)) for a solution M is the difference between the required arrival time (RAT) at a sink si from node v and the delay D(v,si,M) from node v to sink si. The circuit meets its timing constraints if and only if slack $$q(so, M) \geq 0.$$

The problem according to the present invention is, for a given tree $$T = (\{\{so\} \cup SI \cup IN\}, E),$$

a buffer type b, a set of wire codes W, to find a mapping M that maximizes slack $$q(so, M)$$

such that:
1.

$$M(v) \in \{b, \emptyset\}$$

for each $$v \in IN$$

(there is a buffer or no buffer at each internal node of the tree),
2.

$$M(v) = g(v)$$

for each $$v \in \{so\} \cup SI$$

where g(v) is the gate located at node v (a gate is located at the source node and each sink node),
3.

$$M(e) \in W$$

for each $$e \in E$$

(each wire in the tree has a wire code), and
4.

$$M(e_1) = M(e_2)$$

if there exists a node v such that both $$e_1$$

and $$e_2$$

are in $$E_{T(v,M)}$$

(if wires $$e_1$$

and $$e_2$$

are in the same subtree, they each have the same wire code).

The first two constraints ensure the legal assignment of gates and buffers, i.e., gates are at the source node and the sink nodes, and a buffer either is or is not at each internal node. The third constraint ensures that a wire code is assigned to each wire. The fourth constraint enforces a wire code restriction that wire code be the same for each wire in a net or subtree.

The present invention adopts the wire code restriction and disallows wire tapering for several reasons. First, for a majority of nets, buffer insertion with the wire code restriction should be able to meet the timing constraints for the net. When timing constraints cannot be met, placement modification or driver sizing can generally be used more effectively than wire tapering to achieve timing goals. Second, a gridless router is required to exploit a tapered solution; this capability is beyond most current routers. Finally, wire tapering can always be done as a post processing step to detailed routing. The wire code restriction of the present invention simplifies the wire sizing problem.

Figure 2:
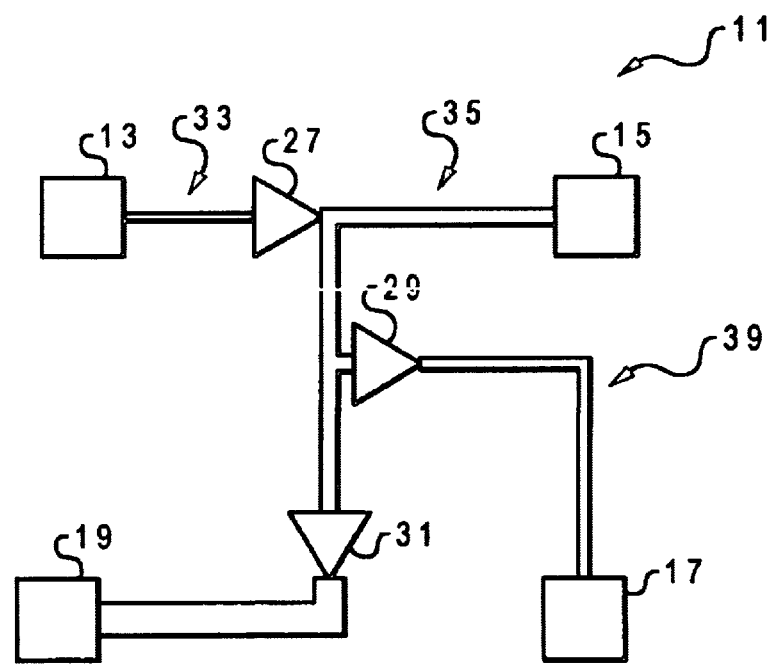
FIG. 2 is a plan view of the tree of FIG. 1 with buffers inserted and wires sized according to the present invention.

Referring now to FIG. 2, there is shown the tree of FIG. 1 optimized according to the present invention. Three buffers 27–31 are inserted at internal nodes of tree 11 selected according to the method of the present invention. The three buffers 27–31 divide tree 11 into four subtrees 33–39. According to the wire code restriction of the present invention, the wire or wires any subtree have the same wire code.

The building block of the method of the present invention is a candidate, which is a 3-tuple (C,q,M), where $$C = C_{T(v,M)}$$

is the lumped capacitance seen at node v, $$q = q(v, M)$$

is the slack at node v, and M is the current solution. The method of the present invention starts at the sinks and works its way up the tree while generating potential candidate solutions. The method is optimal since it potentially generates all possible candidates, but either prunes or never generates inferior solutions. Candidate $$\alpha_1 = (C_1, q_1, M_1)$$

at node v is inferior to candidate $$\alpha_2 = (C_2, q_2, M_2)$$

at node v if $$C_1 \geq C_2$$

and $$q_1 > q_2.$$

The method of the present invention stores an array of linked lists indexed by the possible wire codes. Each node v has a set S of candidates, and S(w) stores the linked list of candidates which must assign w as the wire code for the parent wire of v. The method of the present invention starts with a routing tree T, a buffer type b, a set of wire codes W, and pre-initialized solution M*. M* maps the source node and the sink nodes to their respective gates and sets $$M*(v) = \emptyset$$

for each internal node $$v \in IN.$$

The method returns a mapping M that corresponds to the optimal solution.

Figure 3:
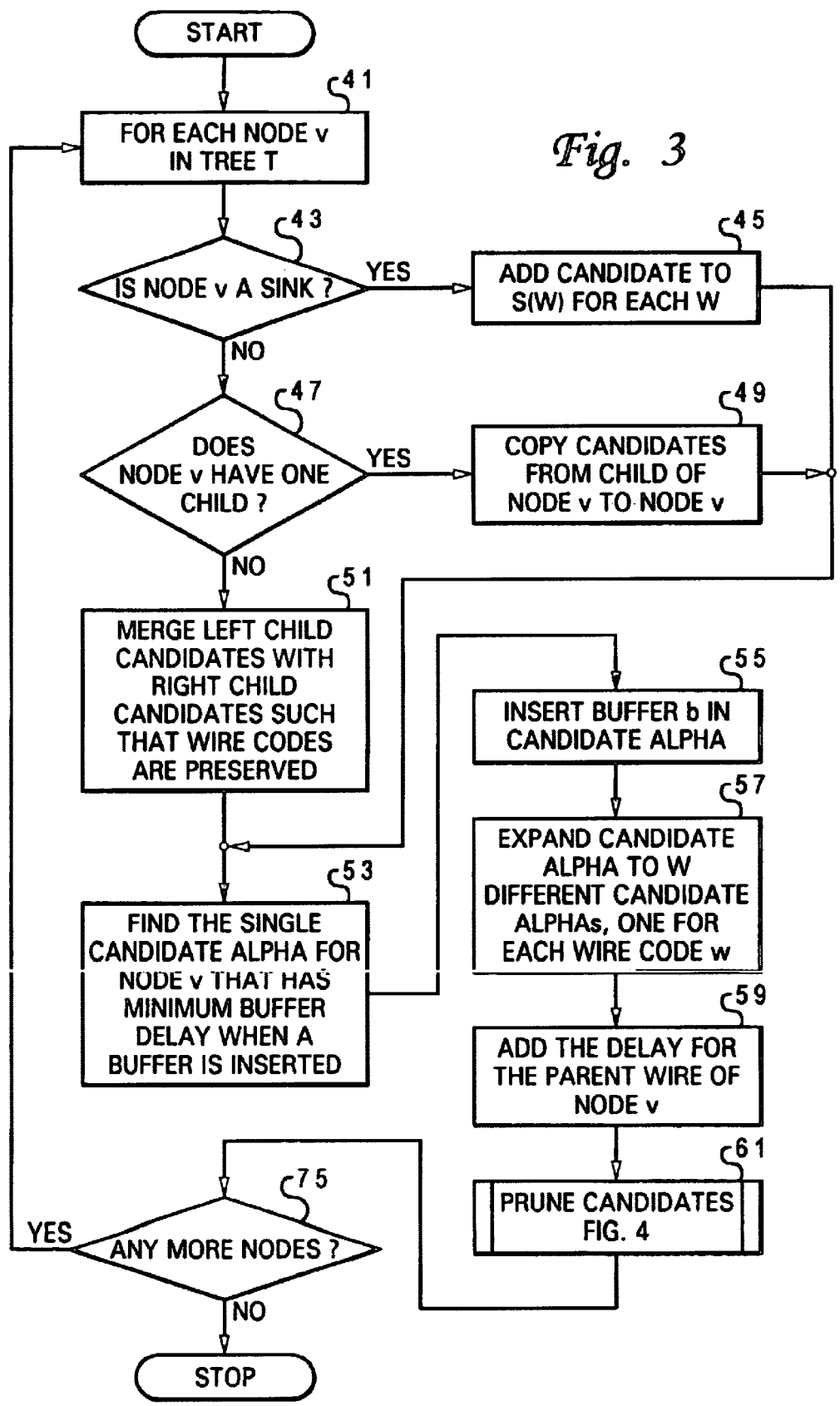
FIG. 3 is a high level flowchart of buffer insertion and wire sizing according to the present invention.

Referring now to FIG. 3, there is shown a flowchart of buffer insertion, layer assignment, and wire sizing according to the present invention. The system of the present invention is preferably implemented in software in memory of a general purpose computer system. As indicated at block 41, FIG. 3 processing is performed for each node v in tree T. The method tests, at decision block 43, node v is sink node. If so, the method generates W (i.e. one for each wire code) candidates and adds the candidates to the set of candidates, as indicated at block 45.

If, at decision block 43, node v is not a sink node, then the method tests, at decision block 47, if node v has only one child. If so, the method copies the candidates from the child of node v to node v, as indicated at block 49. If not, which means that node v has two children, the method merges the left child candidate with the right child candidate, such that wire codes are preserved, as indicated at block 51. The left and right candidates are merged one wire code at a time, thereby ensuring enforcement of the wire code restriction.

After the candidates have been added to the set of candidates at blocks 45, 49, or 51, the method finds the single candidate $$\alpha$$

for node v that has the minimum buffer delay when a buffer b is inserted in candidate $$\alpha,$$

as indicated at block 53. Then the method inserts buffer b in candidate $$\alpha,$$

as indicated at block 55. The best candidate $$\alpha$$

is then expanded to W different candidates $$\alpha,$$

one for each wire code w, at block 57. Then, the method adds the delay of the parent wire of node v to for each candidate and wire code, at block 59.

Figure 4:
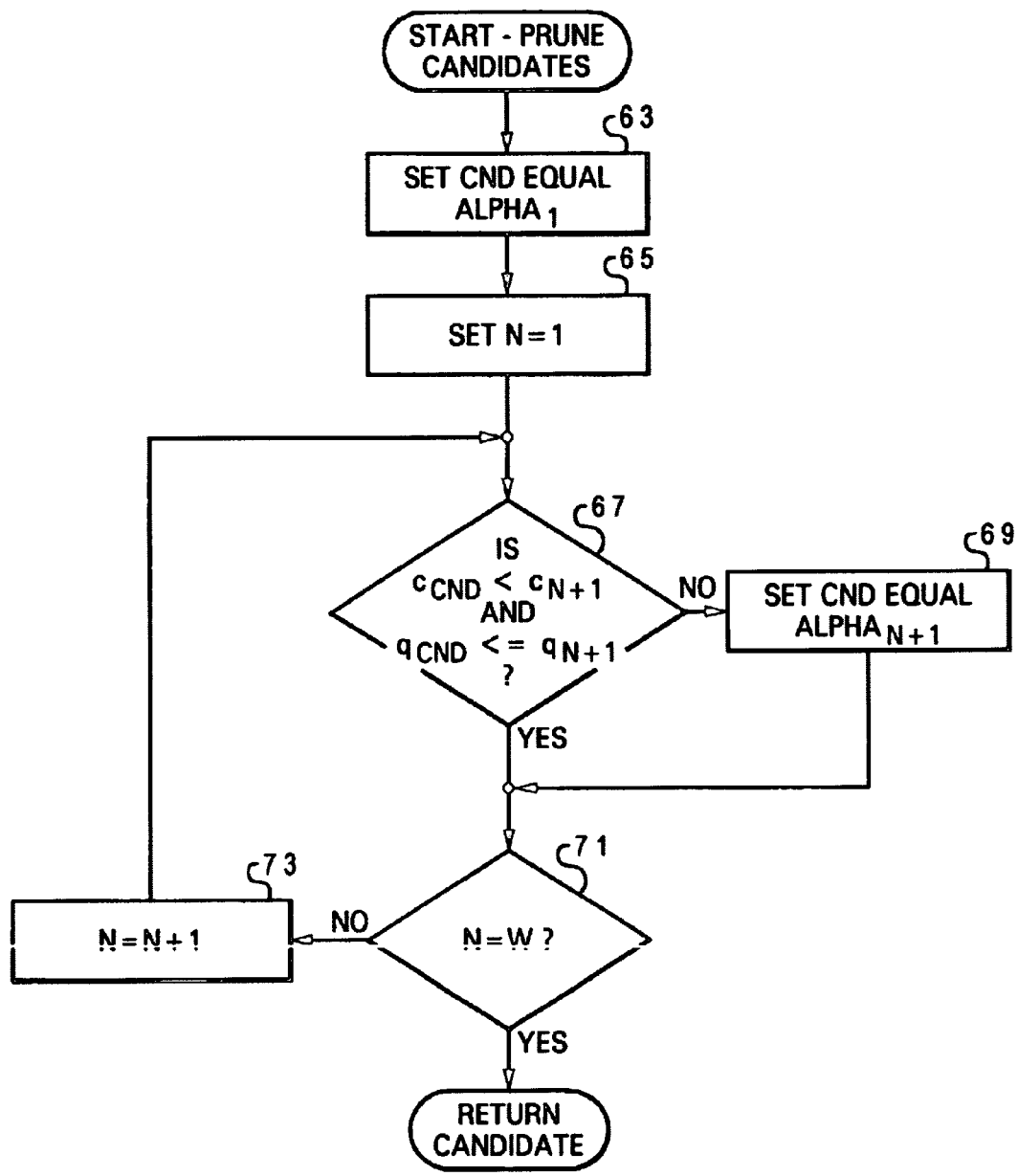
FIG. 4 is a flowchart of the prune candidates step of FIG. 3.

After the method has generated a candidate $$\alpha$$

at node v for each wire code w, the method performs pruning, as indicated generally at block 61 and shown in detail with respect to FIG. 4. The pruning step involves the calculation of the lumped capacitance C seen at node v, and the slack q at node v for each candidate $$\alpha.$$

Referring to FIG. 4, the method first sets the Candidate equal to candidate $$\alpha_1,$$

at block 63, and sets an index N equal to one, at block 65. Then, the method tests, at decision block 67, if the lumped capacitance $$C_{CND}$$

of the Candidate is less than the lumped capacitance $$C_{N+1}$$

of candidate $$\alpha_{N+1}$$

and the slack $$q_{CND}$$

of the Candidate is equal to or less than the slack $$q_{N+1}$$

of candidate $$\alpha_{N+1}.$$

If not, which indicates that the Candidate is inferior to candidate $$\alpha_{N+1},$$

the method sets the Candidate equal to candidate $$\alpha_{N+1},$$

at block 69. If, at decision block 67, the lumped capacitance $$C_{CND}$$

of the Candidate is less than the lumped capacitance $$C_{N+1}$$

of candidate $$\alpha_{N+1},$$

or the slack $$q_{CND}$$

of the Candidate is equal to or less than the slack $$q_{N+1}$$

of candidate $$\alpha_{N+1},$$

then the Candidate is not inferior to candidate $$\alpha_{N+1}.$$

After the method has pruned the inferior candidate, the method tests, at decision block 71, if index N is equal to W, the number of wire codes. If not, the method sets N equal to N+1, at block 73, and FIG. 4 processing continues, at decision block 67. If index N is equal to W, then FIG. 4 processing returns the Candidate to FIG. 3. Referring again to FIG. 3, after the pruning step of block 61, the method tests, at decision block 75, if there are any more nodes. If so, processing continues at block 41. If there are no more nodes, processing ends with a mapping of buffers and wire codes according to the present invention.

A mapping according to the present invention produces an optimum solution, in that it maximizes slack. However, the optimum mapping may be costly in terms of buffers and wire sizing. The optimum solution may use more buffers and size more wires than necessary to meet the timing constraints of the tree. Additionally, while it is desirable to maximize slack, it is only necessary that slack be greater than zero in order to meet the timing constraints for the tree. Thus, according to the present invention, instead of maximizing $$q(so, M),$$

one can minimize total resources such that $$q(so, M) \geq 0.$$

The definition of total resources depends upon the user's requirements. It could be a function of the number of buffers, total buffer size, and the cost of wire codes. Therefore, the present invention uses a new cost function for controlling and minimizing resources.

The cost function of the present invention is a linear combination of buffer and wiring costs. Let bc(M) be the number of buffers in solution M. For wiring costs, a different wire code may imply a different layer assignment. Some layers are more congested than others, and assigning a wire onto a particular layer could increase congestion or create blockage. Hence, using any wire code, regardless of length, should have a fixed cost. Let c(w) be the cost of wire code w. Let wc(M) be the maximum cost of all wire codes, i.e., $$wc(M) = \max\{c(w) | \exists e \in E, M(e) = w\}.$$

The wire cost is bounded above by $$\max_{w \in W} c(w).$$

Let $$\beta$$

be the balancing parameter.

$$\beta = 0$$

implies that only wire sizing is performed.

$$\beta = 1$$

implies that only buffer insertion is performed. For $$0 < \beta < 1,$$

the cost of a solution is given by $$c(\beta, M) = \frac{1}{\beta}bc(M) + \frac{1}{1-\beta}wc(M).$$

As $$\beta$$

goes to zero, the cost of buffer insertion becomes disproportionately high relative to wire sizing. Similarly, as $$\beta$$

goes to one, the cost of wire sizing becomes disproportionately high relative to buffer insertion. One can set $$\beta$$

to trade-off the requirements of the particular problem. For example, in a highly congested routing region, one might set $$\beta = 0.8.$$

In a densely packed transistor region, one might set $$\beta = 0.2.$$

The present invention, seeks to trade-off solution cost with slack reduction. The data structure of the set of candidates S is a 2-dimensional array of lists of candidates. A candidate $$\alpha$$

with cost c belongs to the list S [w] [c] if its current wire code is w. Pruning is accomplished using a separate range-query data structure. However, for the algorithm to be efficient, one must first set an upper bound $$c_{max}$$

for the solution cost. Solutions with cost higher than $$c_{max}$$

are pruned. This scheme may cause erratic behavior for extreme $$\beta$$

(e.g., $$\beta < 0.1$$

values because the range of costs for these $$\beta$$

values can be quite large.

From the foregoing, it may be seen that the present invention overcomes the shortcomings of the prior art. Instead of a polynomial time algorithm, which requires a substantial amount of memory, the method of the present invention runs in $$O(n^2|W|),$$

where n is the number of nodes in the tree, and W is the number of wire codes. The method returns an optimal solution under the Elmore delay model and presents a new trade-off technique for minimizing resource utilization while satisfying timing constraints, by which the user can adjust the degree of wire sizing versus buffer insertion.

What is claimed is:

1. A method of optimizing a tree to meet timing constraints, said tree comprising a source node interconnected by wires to a plurality of sink nodes through a plurality of internal nodes, said method comprising the steps of:
   inserting buffers at selected ones of said internal nodes of said tree to form a plurality of subtrees; and,
   sizing the wires of said plurality of subtrees according to a wire code for each subtree, wherein each wire of a subtree has a same wire code, said wire code defines a) a layer assignment code specifying a layer for said wire and b) a width code for a wire assigned to a layer, said layer assignment code specifies a layer for said wire and said width code specified a width for said wire, and wherein said layer assignment code includes a horizontal layer code and a vertical layer code, and said width code includes a horizontal width code defining a width for a wire in said horizontal layer and a vertical width code defining a width for a wire in said vertical layer.

2. The method as claimed in claim 1, wherein said buffers are inserted and said wires are sized such that slack along the path from said source node to each said sink node is equal to or greater than zero.

3. The method as claimed in claim 2, wherein said slack along at least one of said paths is maximized.

4. The method as claimed in claim 1, wherein said buffers are inserted and said wires are sized according to a balancing parameter.

5. The method as claimed in claim 4, wherein said balancing parameter specifies a balance between buffer insertion and wire sizing.

6. The method as claimed in claim 4, wherein the cost of said buffer insertion and said wire sizing is a function of said balancing parameter.

7. The method as claimed in claim 6, wherein said buffers are inserted and said wires are sized such that said cost is equal to or less than a predefined upper cost bound.

8. A method of optimizing a tree to meet timing constraints, said tree comprising a source node interconnected by wires to a plurality of sink nodes through a plurality of internal nodes, said method comprising the steps of:

selecting at least one of said internal nodes for buffer insertion;

inserting a buffer at said selected at least one of said internal nodes of said tree to form at least two subtrees; and sizing the wires of said plurality of subtrees according to a wire code for each subtree, wherein each wire of a subtree has a same wire code, said wire code defines a) a layer assignment code specifying a layer for said wire and b) a width code for a wire assigned to a layer, said layer assignment code specifies a layer for said wire and said width code specified a width for said wire, and wherein said layer assignment code includes a horizontal layer code and a vertical layer code, and said width code includes a horizontal width code defining a width for a wire in said horizontal layer and a vertical width code defining a width for a wire in said vertical layer.

9. The method as claimed in claim 8, wherein said at least one internal node is selected and said wires are sized such that slack along the path from said source node to each said sink node is equal to or greater than zero.

10. The method as claimed in claim 9, wherein said slack along at least one of said paths is maximized.

11. The method as claimed in claim 8, wherein said at least one internal node is selected and said wires are sized according to a balancing parameter.

12. The method as claimed in claim 11, wherein said balancing parameter specifies a balance between buffer insertion and wire sizing.

13. The method as claimed in claim 11, wherein the cost of said buffer insertion and said wire sizing is a function of said balancing parameter.

14. The method as claimed in claim 13, wherein said at least one internal node is selected and said wires are sized such that said cost is equal to or less than a predefined upper cost bound.

15. An integrated circuit, which comprises:

a tree including a source node interconnected by wires to a plurality of sink nodes through plurality of internal nodes; and buffers inserted at selected ones of said internal nodes of said tree to form a plurality of subtrees, wherein the wires of said subtrees are sized according to a wire code for each subtree, each wire of a subtree having the same wire code, said wire code defines a) a layer assignment code specifying a layer for said wire and b) a width code for a wire assigned to a layer, said layer assignment code specifies a layer for said wire and said width code specified a width for said wire, and wherein said layer assignment code includes a horizontal layer code and a vertical layer code, and said width code includes a horizontal width code defining a width for a wire in said horizontal layer and a vertical width code defining a width for a wire in said vertical layer.

16. The integrated circuit as claimed in claim 15, wherein said buffers are inserted and said wires are sized such that slack along the path from said source node to each said sink node is equal to or greater than zero.

17. The integrated circuit as claimed in claim 15, wherein said slack along at least one of said paths is maximized.

18. The integrated circuit as claimed in claim 15, wherein said buffers are inserted and said buffers are assigned according to a balancing parameter.

19. The integrated circuit as claimed in claim 18, wherein said balancing parameter specifies a balance between buffer insertion and wire sizing.

20. The integrated circuit as claimed in claim 18, wherein the cost of said buffer insertion and said wire sizing is a function of said balancing parameter.

21. The integrated circuit as claimed in claim 20, wherein said buffers are inserted and said wires are sized such that said cost is equal to or less than a predefined upper cost bound.

* * * * *